US006935553B2

(12) United States Patent
Suga et al.

(10) Patent No.: US 6,935,553 B2
(45) Date of Patent: Aug. 30, 2005

(54) REFLOW SOLDERING METHOD

(75) Inventors: Tadatomo Suga, 3-6-3, Higashinakano, Nakano-ku, Tokyo (JP); Keisuke Saito, Yokohama (JP); Yoshikazu Matsuura, Miki (JP); Tatsuya Takeuchi, Kobe (JP); Johji Kagami, Kobe (JP); Rikiya Kato, Souka (JP); Sakie Yamagata, Souka (JP)

(73) Assignees: Senju Metal Industry Co., Ltd., Tokyo (JP); Shinko Seiki Co., Ltd., Kobe (JP); Tadatomo Suga, Tokyo (JP)

( * ) Notice: Subject to any disclaimer, the term of this patent is extended or adjusted under 35 U.S.C. 154(b) by 44 days.

(21) Appl. No.: 10/413,564

(22) Filed: Apr. 15, 2003

(65) Prior Publication Data

US 2004/0007610 A1 Jan. 15, 2004

(30) Foreign Application Priority Data

Apr. 16, 2002 (JP) ...................................... 2002-113802

(51) Int. Cl.[7] ........................ B23K 31/02; B23K 31/00; B23K 35/36

(52) U.S. Cl. ............... 228/180.22; 228/215; 228/248.1; 438/108; 438/455

(58) Field of Search ........................... 228/179.1, 180.1, 228/180.21, 180.22, 215, 224, 248.1; 438/108, 455

(56) References Cited

U.S. PATENT DOCUMENTS 4,919,729 A 4/1990 Elmgren et al. .............. 148/24
4,960,236 A * 10/1990 Hedges et al. ........... 228/180.1
5,000,819 A * 3/1991 Pedder et al. ................. 216/69
5,076,487 A * 12/1991 Bandyopadhyay et al. . 228/219
5,176,759 A 1/1993 Taguchi ....................... 148/24
5,409,543 A * 4/1995 Panitz et al. ................... 134/2
5,433,820 A * 7/1995 Sindzingre et al. ........... 216/13
5,732,874 A * 3/1998 Borzym et al. ............. 228/147
5,786,073 A * 7/1998 Pasch ......................... 428/189
5,831,828 A * 11/1998 Cutting et al. .............. 361/704
5,863,355 A * 1/1999 Ohno et al. ................... 148/26
5,919,317 A 7/1999 Tanahashi et al. ............ 148/24
6,103,549 A 8/2000 Master et al. ............... 438/106
6,220,501 B1 * 4/2001 Tadauchi et al. ............ 228/208
6,271,110 B1 * 8/2001 Yamaguchi et al. ........ 438/613
6,319,810 B1 * 11/2001 Ochiai et al. ............... 438/616
6,429,400 B1 * 8/2002 Sawada et al. ........ 219/121.52
6,451,127 B1 * 9/2002 Li et al. ....................... 148/23
6,468,363 B2 10/2002 Henderson et al. ........... 148/23
6,518,163 B2 * 2/2003 Sakuyama et al. .......... 438/613
6,592,020 B1 * 7/2003 Currie et al. ............... 228/224
6,623,842 B2 * 9/2003 Uchikoba et al. ........... 428/209
6,709,963 B1 * 3/2004 Halderman et al. ......... 438/612
2002/0025667 A1 * 2/2002 Farnworth .................. 438/612

FOREIGN PATENT DOCUMENTS

JP 02290693 11/1990
JP 11163036 6/1999
JP 200158259 3/2001

* cited by examiner

*Primary Examiner*—Colleen P. Cooke
(74) *Attorney, Agent, or Firm*—Michael Tobias

(57) ABSTRACT

A soldering method includes exposing a solder paste including a solder powder and a flux on a member to a free radical gas and heating the solder paste to reflow the solder paste and vaporize any active components in the solder paste. Any flux residue is free of active components, so it is not necessary to perform cleaning after soldering to remove flux residue.

23 Claims, 2 Drawing Sheets

REFLOW SOLDERING METHOD

BACKGROUND OF THE INVENTION

1. Field of the Invention

This invention relates to a reflow soldering method, and particularly to a reflow soldering method employing a solder paste which does not require removal of flux residue after soldering.

2. Description of the Related Art

There is a constant demand by consumers for decreases in the size and weight of electronic equipment. Coping with this demand requires decreases in the size of electronic components contained in such equipment and increases in the packaging density of such components. For this reason, there has been a renewed interest in flip chip technology for mounting electronic components.

In flip chip technology, first developed in the 1960's, a semiconductor chip is placed face down on a substrate (such as a printed circuit board), and terminations on the lower surface of the chip are electrically connected to the upper surface of the substrate. A commonly used method for electrically connecting a flip chip to a substrate is to form solder bumps on the chip and reflow the solder to thereby join the chip to the substrate.

In the past, solder bumps have been prepared by electroplating. However, as the size of solder bumps decreases, especially with lead-free solders, it becomes difficult to form solder bumps by electroplating on an industrial scale due to the high cost of electroplating and the difficulty of forming a large number of solder bumps having a uniform alloy composition by electroplating.

A conceivable alternative to electroplating is to apply a solder paste to a member by printing and then reflow the solder paste to form it into solder bumps. Printing is economical and enables the formation of bumps of good uniformity. A typical solder paste for use in printing comprises a solder powder and a flux. The flux imparts printability to the paste, and it contains one or more active components (activators) for reducing oxides on the surface of solder or the member to be soldered and for increasing the wettability and spreadability of the solder.

With many fluxes, a flux residue remains on the member being soldered at the completion of soldering. The active components in the flux residue are frequently corrosive, so it is necessary to clean off the flux residue to prevent damage to the member being soldered. In the past, flux residue was often cleaned off using a cleaning fluid comprising a chlorofluorocarbon-containing solvent, but the use of such solvents has now been significantly restricted due to their adverse effects on the ozone layer. Therefore, the removal of flux residue has become more challenging than in the past. Furthermore, regardless of what type of cleaning fluid is employed, it can be difficult to completely remove flux residue from a substrate when the spacing between soldered components on the substrate and the spacing between the components and the substrate are extremely small, as is frequently the case with flip chips.

Accordingly, in order to form solder bumps for use with flip chips economically and on an industrial scale, it is important to be able to apply a solder paste to a member by printing without the solder paste leaving a flux residue after reflow soldering. For this reason, research is now being carried out with respect to fluxless soldering, which is soldering not employing a flux.

One method of fluxless soldering which has been proposed comprises applying a fluxless solder to a substrate by plating or vapor deposition and then reflowing the solder to form the solder into bumps while exposing the solder to a plasma, such as a hydrogen plasma Such a method is described in Japanese Published Unexamined Patent Application Hei 11-163036, for example. Free radicals in the plasma exert a reducing action on oxides in the solder and can therefore serve the purpose of the active components in a conventional flux. Since the solder does not contain a flux, there is no formation of flux residue, so there is no need to perform cleaning after soldering to remove flux residues. However, the need to apply the solder by plating or vapor deposition makes the method uneconomical and makes it difficult to uniformly apply the solder, so it is not truly practical as an industrial method. Thus far, there have been no proposals of methods employing the use of a plasma while permitting solder to be applied to a surface by printing.

SUMMARY OF THE INVENTION

The present inventors discovered that by forming a solder paste from a flux which imparts printability to a solder paste and by carrying out reflow soldering using a free radical gas to perform the reducing action traditionally performed by flux, it is possible to carry out reflow soldering without the formation of harmful flux residues and at the same time to enable the solder paste to be applied to a member by printing.

Accordingly, the present invention provides a method for forming solder bumps without leaving a flux residue.

The present invention further provides a method of mounting electronic components on a circuit board without leaving a flux residue.

According to one form of the present invention, a soldering method includes applying a solder paste comprising a solder powder and a flux to a member, and heating the solder paste on the member to reflow the solder paste in a non-oxidizing atmosphere, preferably in a reducing atmosphere and vaporize at least active components of the flux in the solder paste. In a preferred embodiment, the solder paste is heated while being exposed to a free radical gas.

The free radical gas is a gas containing free radicals which can exert a reducing action on the solder paste and the member to be soldered. In preferred embodiments, the free radical gas comprises a hydrogen radical gas obtained from a hydrogen plasma.

The solder powder is not restricted to any particular type but is preferably a lead-free solder powder.

In preferred embodiments, the solder paste is applied to the member by printing.

The reflow of the solder paste applied to a member may form the solder paste into bumps on the member without joining the member to another member, or the reflow may join the member to another member by the solder. For example, the reflow may be used to mount electronic components on a substrate.

DESCRIPTION OF PREFERRED EMBODIMENTS

Figure 1:
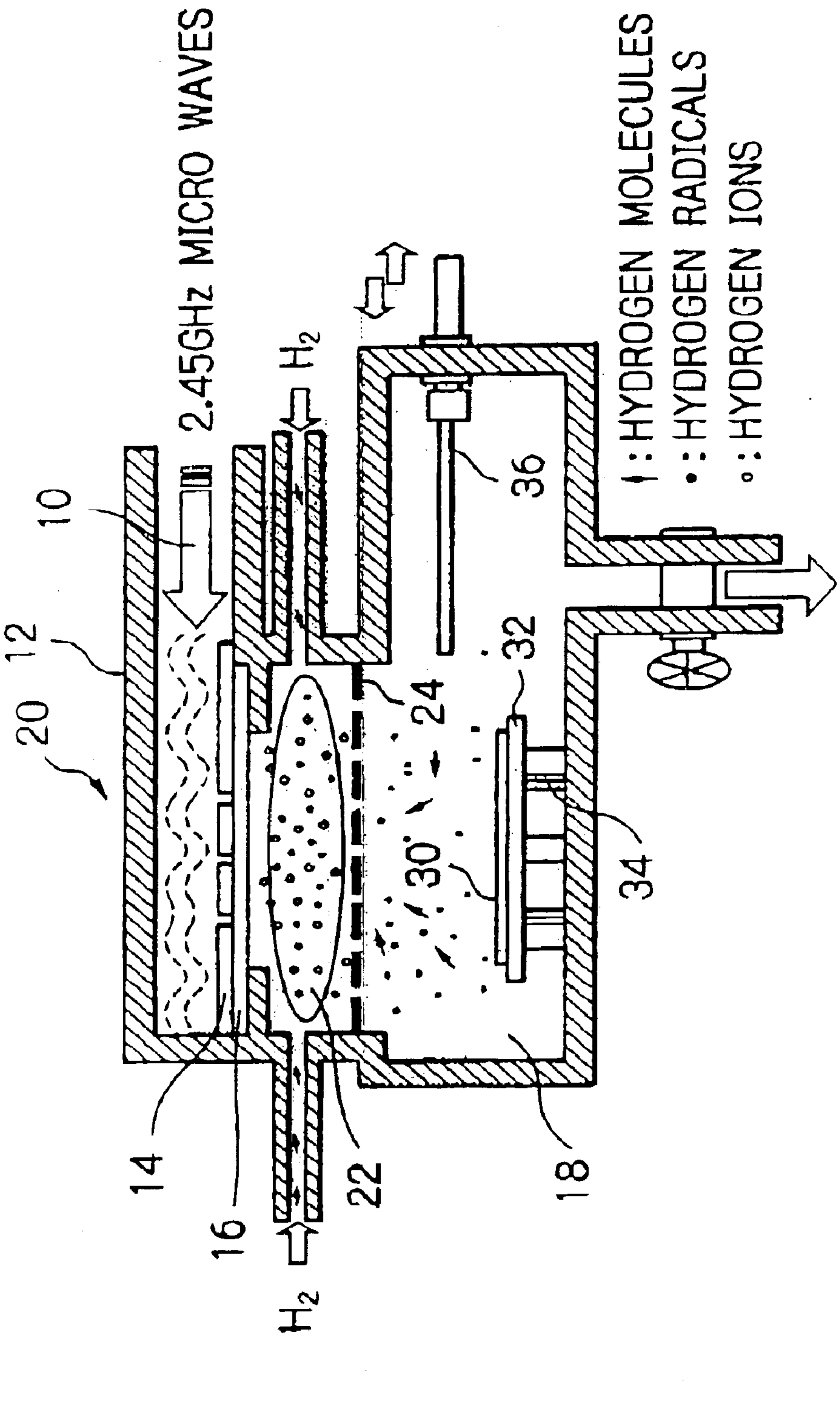
FIG. 1 is a schematic cross-sectional elevation of an example of a reflow soldering apparatus employing a plasma which is suitable for use in the present invention.

A solder paste for use in a soldering method according to the present invention comprises a solder powder and a flux. In the present invention, the primary purpose of the flux is to impart printability to the solder paste, and the reducing action which is conventionally exerted by the active components of fluxes for solder paste is instead primarily exerted by a free radical gas formed from a gas plasma. Therefore, the flux will include one or more components for imparting printability to the paste, but it is not necessary for the flux to include any active components (activators) which exert a reducing action. However, in cases in which the reducing action of the free radical gas is not sufficient, the flux may include one or more active components (activators) for exerting a reducing action which will vaporize substantially entirely at the reflow temperature of the solder powder in the solder paste.

Substantially all of the components of the flux vaporize at the reflow temperature of the solder powder in the solder paste, but it is permissible for a small amount of a flux component, e.g., a thixotropic agent in an amount of 0.5% or less of the flux to remain after soldering so long as the flux component does not form a harmful flux residue and does not interfere with the reducing action of the free radical gas.

Examples of components for imparting printability to a solder paste which vaporize at reflow temperatures and which are suitable for use in the present invention are all type of thixotropic agents which can function as separation suppressing agents. Specific examples of suitable thixotropic agents are hardened castor oil, stearamide, and bis-p-methylbenzylidene-sorbitol.

Some examples of active components (activators) which vaporize at reflow temperatures and can therefore be included in a flux for use in the present invention are organic acids such as butylbenzoic acid and adipic acid, and amine salts such as succinic acid monoethanolamine salt.

A solder paste according to the present invention may also include a solvent. As with conventional solder pastes, the solvent will easily evaporate during reflow. Any type of solvent employed in conventional solder pastes may be used in the present invention. From the standpoint of obtaining good printability, a solvent which has a high viscosity and which can easily dissolve any active components in the flux is preferred. An example of a preferred solvent is an alcohol, such as one or more of trimethylolpropane, isobornylcyclohexanol, and tetraethyleneglycol. Diethyleneglycol-monobutylether and tetraethyleneglycol may also be used.

There are no particular restrictions on the composition of the solder powder in a solder paste used in the present invention. From a health and environmental standpoint, a lead-free solder powder is preferred, but a lead-containing solder powder is also possible. The solder powder may comprise one or more elemental metal powders, one or more solder alloy powders, or a mixture of elemental and alloy powders. The particle size and other characteristics of the solder powder can be selected in accordance with the intended use of the solder paste, the desired soldering temperature, and other requirements.

Other examples of solder pastes which are suitable for use in a soldering method according to the present invention are described in the United States latent Application by Tadatomo SUGA et al. filed concurrently with the present application and entitled "Residue-Free Solder Paste", the disclosure of which is incorporated by reference.

The solder powder and the flux can be mixed by standard techniques to form a solder paste having a desired viscosity. The solder paste can then be applied by standard printing techniques to a member on which the solder paste is to be reflowed.

A reflow soldering method according to the present invention can be performed using any apparatus capable of exposing a member having a solder paste thereon to a free radical gas and heating the member and the solder paste to a reflow temperature. One example of a reflow soldering apparatus suitable for use in the present invention is the apparatus disclosed in Japanese Published Unexamined Patent Application 2001-58259 and schematically illustrated in the cross-sectional elevation of FIG. 1. Since that apparatus is described in detail in that publication, it will be described only briefly below.

In the apparatus shown FIG. 1, microwaves 10 at 2.45 GHz which are generated by an unillustrated magnetron or other suitable device for generating microwaves pass through a rectangular wave guide 12, and then pass through a slot antenna 14 and a quartz window 16 into a vacuum chamber 18.

A process gas in the form of hydrogen gas can be introduced into a plasma generating portion 22 of the vacuum chamber 18 from an unillustrated source. Microwaves which are incident on the hydrogen gas in the plasma generating portion 22 generate a surface wave plasma.

In the illustrated apparatus, the maximum power of the microwaves is typically 3 kw, and at a gas pressure of 50–250 Pa in the vacuum chamber 18, a stable high-density plasma is obtained.

The flow rate of hydrogen which is introduced into the plasma generating portion, 22 is typically regulated so as to be in the range of 10 m/min to 500 mil/min. The pressure in the vacuum chamber 18 can be adjusted by adjusting the flow rate of introduced hydrogen and adjusting a discharge valve 38 connected to an unillustrated vacuum pump.

In its lower portion, the vacuum chamber 18 contains a heater 32 on which a member 30 to undergo reflow soldering can be placed during reflow soldering. The member 30 can be introduced into the vacuum chamber 18 from an unillustrated load lock by a conveyor arm 36, and the member 30 can be lowered onto or raised above the heater 32 by a plurality of lift pins 34.

The hydrogen plasma contains hydrogen radicals and hydrogen ions. Exposure of a substrate having a Ni film formed thereon by vapor deposition to hydrogen ions for even a short period (such as 1 minute) can cause peeling of the Ni film. Therefore, in order to prevent hydrogen ions in the plasma from reaching a member 30 disposed on the heater 32, an electrically grounded shield 24 comprising a perforated metal plate, a metal mesh, or other suitable structure is disposed across the vacuum chamber 18 between the plasma generating portion 22 and the member 30. Because the shield 24 is electrically grounded, hydrogen ions which are formed in the plasma are trapped by the shield 24 and cannot reach the member 30, while hydrogen molecules and hydrogen radicals can pass through the shield 24 into the space surrounding the member 30. When a shield is present, even when a member having a Ni film formed thereon is disposed for 20 minutes on the heater 32 while a plasma is formed in the plasma generating portion 22, no change is seen in the Ni film on the member 30.

A reflow soldering method according to the present invention is not limited to employing any particular free radical gas, but a hydrogen radical gas formed from a hydrogen plasma is preferred because it is not corrosive. The process gas which is supplied to the vacuum chamber 18 in order to form a plasma may include more than one substance. For example, when the plasma which is formed in the plasma generating portion 22 is a hydrogen plasma, the process gas may include an inert gas in addition to hydrogen.

The steps in a reflow method according to the present invention can be similar to those in a conventional method of reflow soldering in which a member is exposed to a free radical gas, such as the method described in Japanese Published Unexamined Patent Application 2001-58259 mentioned above. An example of a procedure for carrying out a reflow method according to the present invention using the apparatus of FIG. 1 is briefly as follows.

After the vacuum chamber 18 has been evacuated by operation of the unillustrated vacuum pump, hydrogen gas is introduced into the vacuum chamber 18, and the gas pressure in the vacuum chamber 18 is adjusted to a prescribed value in the range of 50–250 Pa, for example. The heater 32 is operated so as to maintain the temperature of a member 30 to be treated at a prescribed value corresponding to the pressure, such as 225–230° C.

A member 30 to which a solder paste has been applied is introduced into the vacuum chamber 18 from an unillustrated load lock by the conveyor arm 36 and placed atop the lift pins 34, with the surface of the member 30 on which the solder paste has been applied facing upwards.

The member 30 is lowered by the lift pins 34 until it rests atop the heater 32. When the temperature of the upper surface of the member 30 is sufficiently high, the hydrogen gas in the plasma generating portion 22 is irradiated by microwaves from the wave guide 12 to commence generation of a plasma. When a prescribed length of time has passed, irradiation with microwaves and the supply of hydrogen to the plasma generating portion 22 are stopped to terminate generation of a plasma, and cooling of the member 30 is commenced. At this time, the lift pins 34 are raised to lift the member 30 off the heater 32, the member 30 is moved to the conveyor arm 36, and cooling of the member 30 is carried out with the member 30 supported by the conveyor arm 36.

As a result of cooling, the reflowed solder solidifies as solder bumps attached to the member 30. Because the solder paste has been applied to the member 30 by printing, the resulting solder bumps are highly uniform and of high dimensional accuracy. The solder bumps can subsequently be used to join the member 30 (or portions of the member 30) to another member by reflow soldering. When the member 30 is a semiconductor wafer having integrated circuits formed thereon, solder bumps will typically be formed by the method of the present invention on pads of the integrated circuits. After bump formation, the member 30 can then be cut up (diced) into individual chips each having a plurality of the solder bumps formed thereon. Each chip can then be connected to a substrate by reflow soldering of the solder bumps, The reflow soldering can be carried out in an apparatus employing a free radical gas similar to the apparatus used to initially form the solder bumps, without the need for a flux.

A reflow soldering method according to the present invention can also be used to join two members to each other without first forming solder bumps on either of the members. In this form of the present invention, a solder paste is applied by printing to one or both of the members, and the members are then disposed with respect to each other such that the solder paste is sandwiched between the two members. The two members are then placed in a reflow soldering apparatus employing a free radical gas, which may have the same structure as a reflow soldering apparatus described above used for forming solder bumps. The solder paste is made to reflow in the reflow soldering apparatus, and after solidification of the solder alloy in the solder paste, the two members are joined to each other by the solder alloy.

EXAMPLES

The present invention will be described in further detail by the following examples.

Example 1

Reflow was carried out with the reflow soldering apparatus shown in FIG. 1 using two solder pastes (Paste 1 and Paste 2). Each paste comprised solder alloy particles and a flux. The composition of the flux for each paste is shown in Table 1.

TABLE 1

| Component of flux | Composition of component | Content (mass %) Paste 1 | Paste 2 |
|---|---|---|---|
| Solvent (alcohol-based solvent) | mixed solvent comprising trimethylolpropane, isobornylcyclohexanol, and tetraethyleneglycol | 87.5% | 83.8% |
| active components | organic acid: butylbenzoic acid | 10% | — |
| | amine salt of an organic acid (low temperature*): succinic acid monoethanolamine salt | 2% | 6% |
| separation suppressing agent | thixotropic agent (high temperature*): bis-p-methylbenzylidene-sorbitol | 0.5% | 0.2% |
| | thixotropic agent (low temperature*): stearamide | — | 10% |

*High temperature and low temperature respectively mean a substance that vaporizes at a temperature which is higher than or lower than thy melting point of the solder powder in the solder paste.

The solder alloy particles in each paste had a diameter of 5–15 $\mu$m and a composition of Sn-3.0 Ag-0.5 Cu (mass %). This alloy composition is superior to an Sn—Pb solder alloy with respect to strength and thermal fatigue properties.

The flux constituted 9.5–10.5 mass % (approximately 50% of the volume) of the paste. As active components, the flux included an amine salt of an organic acid and, in the case of Paste 1, an organic acid, both having low activity.

Figure 2:
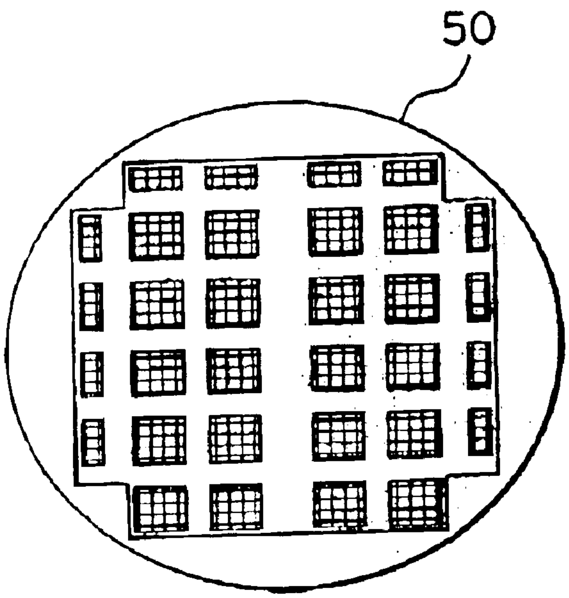
FIG. 2 is a schematic plan view of an 8-inch wafer subjected to reflow in examples of the present invention.
Figure 3:
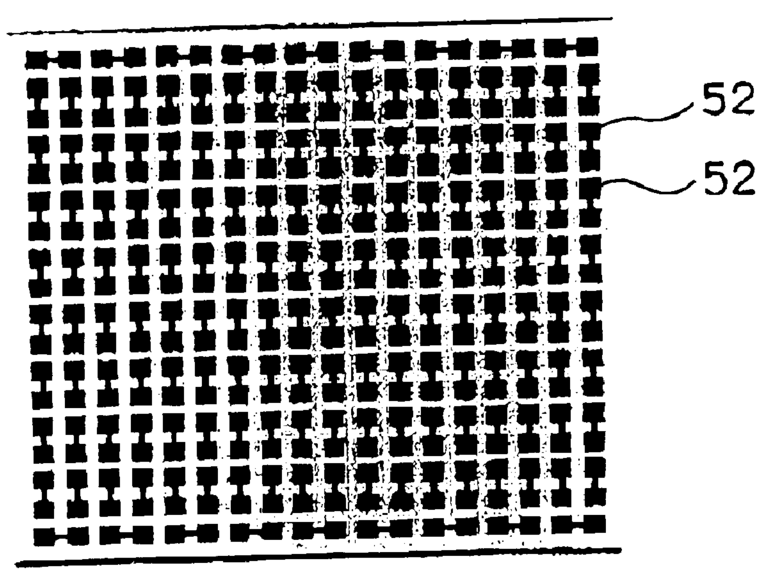
FIG. 3 is an enlarged overall view of a chip pattern formed on the wafer of FIG. 2.

8-inch wafers 50 having chip patterns formed thereon were used as a substrate for bump formation. As shown in FIG. 2, each wafer 50 had 104 chip patterns each measuring 9.6×9.6 mm formed thereon, and as shown in FIG. 3, each chip pattern had 18×18=324 pads 52 for the formation of bumps. Therefore, 104×324=34992 bumps could be formed on each wafer 50.

The solder pastes of Table 1 were applied to the wafers by printing using a Model TD-4421 printer manufactured by Tani Denki Kougyou of Japan. The wafers were then subjected to reflow by the following procedure.

Each wafer was placed inside the vacuum chamber 18 of the reflow apparatus atop the lift pins 34, and the wafer was lowered by the lift pins 34 to atop the heater 32. The heater 32 was operated so as to maintain a wafer temperature of 225–230° C., and reflow was carried out under a hydrogen pressure of 50–200 Pa.

When 3 minutes had passed after a wafer 50 was mounted on the heater 32, the hydrogen gas was irradiated with microwaves of 2.5 kW power to form a surface wave plasma.

After 15 seconds to one minute had elapsed from the start of plasma. formation, the supply of hydrogen radicals was stopped, the lift pins 34 were raised, and the wafer 50 was moved to the conveyor arm 36 and cooled.

As a comparative example, a wafer 50 was heated in a hydrogen atmosphere without exposure to hydrogen radicals.

The results for the example of the present invention and the comparative example are shown in Table 2. Since the results were substantially the same for both solder pastes using Pastes 1, 2, respectively, Table 2 shows those of the solder paste using Paste 1. In the Results column in Table 2, good indicates that burps were formed on all the pads of a wafer without any apparent flux residue, while fair indicates that a small number of bumps were formed unsuccessfully on a portion of the pads of a wafer.

TABLE 2

| Reflow atmosphere | Pressure during reflow | Wafer Temperature | Heating Time | Plasma generating time | Results |
|---|---|---|---|---|---|
| Hydrogen radical gas | 50 Pa<br>100 Pa<br>200 Pa | 225–230° C. | 3 min | 1 min | Good |
| Hydrogen gas | 200 Pa | 225–230° C.<br>335–340° C. | 15 min | 0 min | Fair<br>Fair |

In order to evaluate wettability, solder paste was applied to pads of a wafer, and reflow was performed to form a 10×10 array of bumps having a pitch of 210 μm and a diameter of 160 μm for each bump. Reflow was carried out either by a heating method in a nitrogen atmosphere or by the method according to the present invention using a plasma. The results are substantially the same for the solder pastes using Paste 1 and 2, and are shown in Table 3. Good indicates that there was adequate wetting of the pads by the solder paste, and poor indicates that wetting of the pads by the solder paste was not observed.

TABLE 3

| Reflow atmosphere | Pressure of reflow atmosphere | Wafer temperature | Heating temperature | Plasma generating time | Results |
|---|---|---|---|---|---|
| Nitrogen atmosphere | Atmospheric | 225–230° C. | 5 min | 0 min | Poor |
| Hydrogen radical gas | 200 Pa | 225–230° C. | 3 min | 1 min | Good |

To demonstrate the ability of solder bumps formed by the method of the present invention to be used in subsequent reflow operations, semiconductor chips measuring 6 mm on a side and having solder bumps formed thereon by the procedure described in Example 1 were subjected to reflow in the reflow soldering apparatus of FIG. 1. The pressure of the hydrogen atmosphere in the apparatus was 200 Pa, and hydrogen radicals were supplied to the chips for one minute by forming a hydrogen plasma. The solder bumps underwent satisfactory melting.

Example 2

Each of the solder pastes of Example 1 was printed on the pads and the lands of semiconductor chips and a printed circuit board, respectively. The chips were placed on the printed circuit board with the solder paste sandwiched between the chips and the printed circuit board. The chips and the printed circuit board were placed in a reflow soldering apparatus like that shown in FIG. 1 and heated to a reflow temperature while being exposed to a hydrogen radical gas. For comparison, another printed circuit board having chips disposed thereon in the same manner was heated to a reflow temperature in the same reflow soldering apparatus while being exposed to hydrogen gas but without the formation of a hydrogen plasma.

When the solder paste was heated while being exposed to a hydrogen radical gas, the chips were reliably joined to the printed circuit board by the solder. In contrast, when the solder paste was heated while being exposed only to a hydrogen gas atmosphere, the chips could not be reliably joined to the printed circuit board. When a hydrogen plasma is being generated in the apparatus, hydrogen ions in the plasma are prevented from reaching the solder paste by the perforated metal plate 24, so it is clear that a reducing action is exerted on the solder paste by hydrogen radicals in the plasma.

From the above description, it can be seen that a reflow soldering method according to the present invention can form minute bumps or join electronic components to a substrate without the formation of harmful flux residue, so there is no need to perform cleaning after soldering to remove flux residue. Furthermore, the present method enables a solder paste to be applied to a member by printing, so it has a high efficiency which makes it suitable for use on an industrial scale.

What is claimed is:

1. A soldering method comprising:

applying a solder paste, which comprises a solder powder and a flux, to a member;

forming a free radical gas by generating a plasma and separating free radicals from ionic species in the plasma; and heating the solder paste on the member to reflow the solder paste and vaporize at least active components, if present, of the flux in the solder paste while exposing the solder paste to the free radical gas.

2. A method as claimed in claim 1 wherein the free radical gas is a gas comprising hydrogen radicals.

3. A method as claimed in claim 1 including applying the solder paste to the member by printing.

4. A method as claimed in claim 1 including forming solder bumps on the member by reflowing the solder paste.

5. A method as claimed in claim 1 including joining the member to another member by reflowing the solder paste.

6. A method as claimed in claim 1 including applying the solder paste by printing to at least one of an electronic component and a printed circuit board, contacting the electronic component and the printed circuit board, and reflowing the solder paste to join the electronic component to the printed circuit board.

7. A method as claimed an claim 1 wherein the solder paste is a lead-free solder paste.

8. A method as claimed in claim 1 wherein the flux contains an organic acid as an active component.

9. A method as claimed in claim 8 wherein the organic acid is selected from butyl benzoic acid and adipic acid.

10. A method as claimed in claim 1 wherein the flux contains an amine salt as an active component.

11. A method as claimed in claim 10 wherein the flux contains succinic acid monoethanol amine salt.

12. A method as claimed in claim 1 including applying the solder paste by printing to at least one of a flip chip and a substrate, contacting the flip chip and the substrate, and reflowing the solder paste to join the flip chip to the substrate.

13. A method as claimed in claim 1 including generating a hydrogen plasma in a first region, and exposing the solder paste to the free radical gas comprises allowing hydrogen radicals and hydrogen atoms in the hydrogen plasma to pass into a second region containing the member while preventing hydrogen ions in the hydrogen plasma from passing into the second region.

14. A method as claimed in claim 1 wherein the solder paste prior to the heating is free of active components which exert a reducing action on the member.

15. A method as claimed in claim 1 including vaporizing at least 99.5 mass % of the flux during the heating.

16. A method as claimed in claim 1 wherein the member comprises a semiconductor wafer, and heating the solder paste forms the paste into a predetermined array of solder bumps on the wafer.

17. A soldering method comprising:

applying a solder paste, which comprises a solder powder and a flux, to a member by printing;

generating a plasma containing atomic species and ionic species;

separating the atomic species from the ionic species to obtain a free radical gas containing the atomic species but not the ionic species; and heating the solder paste on the member to reflow the solder paste while exposing the solder paste to the free radical gas.

18. A method as claimed in claim 17 wherein the member is selected from a semiconductor wafer, a flip chip, and a printed circuit board.

19. A method as claimed in claim 17 including applying the solder paste to at least one of an electronic component and a printed circuit board, contacting the electronic component and the printed circuit board, and reflowing the solder paste to join the electronic component to the printed circuit board.

20. A method as claimed in claim 17 wherein the heating includes vaporizing at least 99.5 mass % of the flux.

21. A method as claimed in claim 17 including applying the solder paste to at least one of a flip chip and a substrate, contacting the flip chip and the substrate, and reflowing the solder paste to join the flip chip to the substrate.

22. A method as claimed in claim 17 wherein the member comprises a semiconductor wafer, and heating the solder paste forms the paste into a predetermined array of solder bumps on the wafer.

23. A method as claimed in claim 17 wherein the solder paste prior to the heating is free of active components which exert a reducing action on the member.

* * * * *